United States Patent
Knotter et al.

(10) Patent No.: US 7,001,838 B2
(45) Date of Patent: Feb. 21, 2006

(54) METHOD OF WET ETCHING AN INORGANIC ANTIREFLECTION LAYER

(75) Inventors: Dirk Maarten Knotter, Nijmegen (NL); Johannes Van Wingerden, Eindhoven (NL); Madelon Gertruda Josephina Rovers, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 67 days.

(21) Appl. No.: 10/475,884

(22) PCT Filed: Apr. 18, 2002

(86) PCT No.: PCT/IB02/01411

§ 371 (c)(1), (2), (4) Date: Oct. 24, 2003

(87) PCT Pub. No.: WO02/089192

PCT Pub. Date: Nov. 7, 2002

(65) Prior Publication Data

US 2004/0115926 A1 Jun. 17, 2004

(30) Foreign Application Priority Data

Apr. 27, 2001 (EP) .................... 01201595

(51) Int. Cl.
*H01L 21/4763* (2006.01)

(52) U.S. Cl. .............. 438/636; 438/669; 438/724
(58) Field of Classification Search ............... 438/669, 438/694, 745, 751, 724, 636
See application file for complete search history.

(56) References Cited

U.S. PATENT DOCUMENTS

| 6,121,123 A | * | 9/2000 | Lyons et al. | ............... 438/585 |
| 6,200,863 B1 | * | 3/2001 | Xiang et al. | ............... 438/286 |
| 6,585,910 B1 | * | 7/2003 | Kikuyama et al. | ......... 252/79.3 |

* cited by examiner

Primary Examiner—Hsien-Ming Lee
(74) Attorney, Agent, or Firm—Peter Zawilski

(57) ABSTRACT

The invention relates to a method of manufacturing a semiconductor device, comprising the provision of a substrate with a layer of silicon thereon, an inorganic anti-reflective layer applied to the layer of silicon, and a resist mask applied to the inorganic anti-reflective layer, which method comprises the steps of:

patterning the inorganic anti-reflective layer by means of the resist mask,
  patterning the layer of silicon,
  removing the resist mask, and
  removing the inorganic anti-reflective layer by means of etching with an aqueous solution comprising hydrofluoric acid in a low concentration, which aqueous solution is applied at a high temperature.

18 Claims, 1 Drawing Sheet

METHOD OF WET ETCHING AN INORGANIC ANTIREFLECTION LAYER

CROSS REFERENCE TO RELATED APPLICATIONS

This application is a 371 of PCT/IB02/01411, filed Apr. 18, 2002.

FIELD OF THE INVENTION

The invention relates to a method of manufacturing a semiconductor device, comprising the provision of a substrate with a layer of silicon thereon, an inorganic anti-reflective layer applied to the layer of silicon, and a resist mask applied to the inorganic anti-reflective layer.

BACKGROUND

Such a method is known from U.S. Pat. No. 5,963,841. According to this method conductive gates are formed in a semiconductor device through the use of a "bottom anti-reflective coating" (BARC). The starting material is the substrate provided with a dielectric layer, a conductive layer, e.g. of polycrystalline silicon, a BARC layer provided with an oxide layer, and a resist mask. The regions of the oxide layer selected by the resist mask, the BARC, and the conductive layer are etched. Then the resist mask is removed so that the subjacent oxide layer becomes exposed. The oxide layer is then removed using a conventional wet etching technique and HF (hydrofluoric acid) solution, which exposes the BARC. Finally, the remaining BARC is removed using a conventional wet etching technique and $H_3PO_4$ (phosphoric acid) solution.

It was found in the known method that a loss of the critical dimension (CD) of the gate occurs. The dimension of the passage in the conductive layer does not correspond exactly anymore to the dimension defined by the resist mask. A good CD control is of a major importance in view of the continuing trend towards decreased dimensions of devices within an integrated circuit.

SUMMARY OF THE INVENTION

The invention has for its object inter alia to provide a method of the kind mentioned in the opening paragraph in which no or substantially no changes occur in the CD.

The method according to the invention for this purpose comprises the steps of:
- patterning the inorganic anti-reflective layer by means of the resist mask,
- patterning the layer of silicon,
- removing the resist mask, and
- removing the inorganic anti-reflective layer by means of etching with an aqueous solution comprising hydrofluoric acid in a low concentration, which aqueous solution is applied at a high temperature.

During etching the inorganic anti-reflective layer attack of the exposed sidewalls of the layer of silicon is counteracted. As a result, the inorganic anti-reflective layer can be removed without any important change occurring in the critical dimension (CD). Moreover, once the top wall of the layer of silicon is exposed, attack of this top wall is also counteracted during the above-mentioned etching process.

Further advantageous embodiments of the method in accordance with the invention are described in the dependent claims.

The invention further relates to an apparatus for carrying out the step of removing an inorganic anti-reflective layer by means of etching with an aqueous solution comprising hydrofluoric acid in a low concentration, which aqueous solution is applied at a high temperature.

BRIEF DESCRIPTION OF THE DRAWINGS

These and other aspects of the invention will be explained in more detail with reference to the drawing, in which.

DETAILED DESCRIPTION

FIGS. 1 to 4 schematically show a number of stages in a process in accordance with the invention for the manufacture of a semiconductor device.

Figure 1:
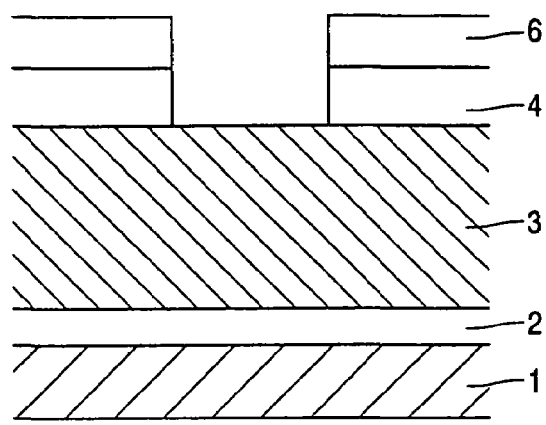
FIGS. 1 to 4 show in diagrammatic cross-sectional views successive stages in the manufacture of a semiconductor device using the method in accordance with the invention.
Figure 2:
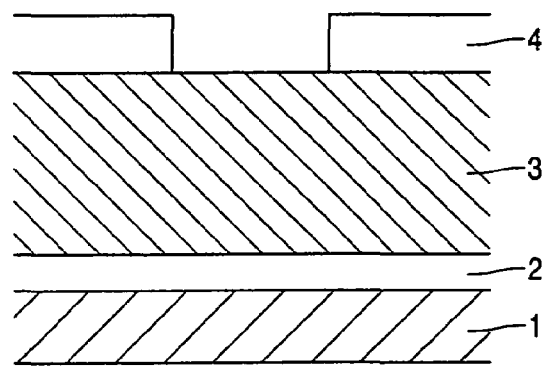

FIG. 1 shows a substrate 1, which consists of a semiconductor body, for example a silicon body, provided with a layer of a dielectric material 2 as uppermost layer. It will be clear to a person skilled in the art that, dependent on the stage of the manufacturing process, the substrate 1 can consist of other layers and structures in addition. On the layer of dielectric material 2 there is a layer of silicon 3. The layer of silicon 3, which in the present example is applied as a gate layer, is advantageously applied as a layer of polycrystalline silicon or amorphous silicon. On the layer of silicon 3 an inorganic anti-reflective layer 4 is applied, which inorganic anti-reflective layer is advantageously applied as a layer of silicon nitride or silicon oxynitride, and preferably as a layer of silicon-rich silicon nitride or silicon-rich silicon oxynitride. The layer of dielectric material 2, which is applied as gate dielectric layer in the present example, is advantageously composed of a material with respect to which the inorganic anti-reflective layer (4) can be selectively etched, such as silicon oxide or a silicon oxide like material. The inorganic anti-reflective layer 4 is provided with a resist mask 6. In between the inorganic anti-reflective layer 4 and the resist mask 6 another layer such as, for example, a silicon oxide layer may be present. The inorganic anti-reflective layer 4 is patterned by means of the resist mask 6 in a usual way. Then, the resist mask 6 is removed in a usual way (FIG. 2).

Figure 3:
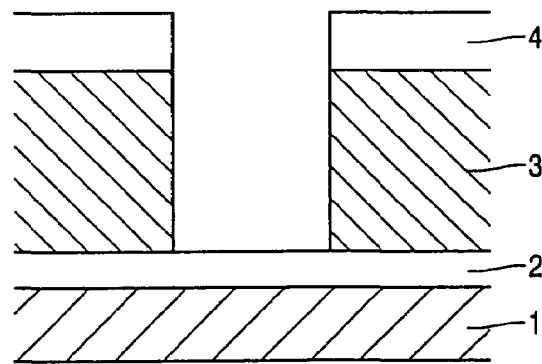

In FIG. 3, the layer of silicon 3 is patterned in a usual way down to the layer of dielectric material 2 by means of etching while using the patterned inorganic anti-reflective layer 4 as a hard mask.

Figure 4:
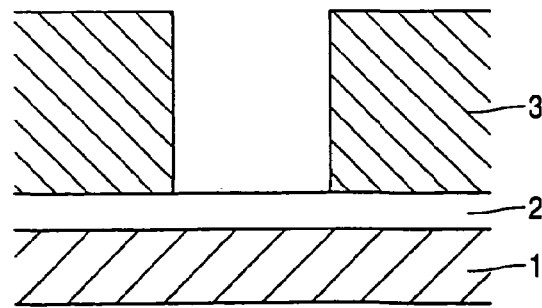

In FIG. 4, the inorganic anti-reflective layer 4 is removed by means of etching with an aqueous solution comprising hydrofluoric acid in a low concentration, preferably a concentration in the range from about 0.001 to 0.1 M. The aqueous solution is applied at a high temperature, preferably a temperature in the range from about 30° C. to 130° C., and more preferably a temperature in the range from 100° C. to 130° C. The temperature of the aqueous solution can be increased to a value above 100° C. by using the aqueous solution at elevated pressure. This can be accomplished, for example, by delivering a pressurized inert gas into the process chamber wherein etching of the inorganic anti-reflective layer is carried out. Another way of accomplishing the above may be by heating up the aqueous solution to the desired temperature in a closed airtight system. During this heating-up the pressure inside the closed airtight system rises which in turn causes an increase in the temperature of the aqueous solution that can be ultimately reached. A still further way may be by using a hydraulic pump.

By means of this etching process attack of the exposed sidewalls of the layer of silicon 3 is counteracted. As a result, the inorganic anti-reflective layer 4 can be removed without any important change occurring in the critical dimension (CD). Moreover, once the top wall of the layer of silicon 3 is exposed, attack of this top wall is also counteracted during the above-mentioned etching process. Furthermore, this etching process has in addition a good selectivity with respect to the layer of dielectric material 2, that is the inorganic anti-reflective layer 4 is etched at a rate significantly greater than that of the layer of dielectric material 2. The higher the temperature in the range from 30 to 130° C., the higher the etch rate of the inorganic anti-reflective layer 3 and the higher the etch selectivity with respect to the layer of dielectric material 2. Moreover, in order to improve the etch selectivity between the inorganic anti-reflective layer 4 and the layer of silicon 3, i.e. to reduce the etch rate of the layer of silicon 3 relative to that of the inorganic anti-reflective layer 4, it is preferred to treat the aqueous solution in such a way that the layer of silicon 3 is kept in an non-oxidized state during etching the inorganic anti-reflective layer 4. This can be accomplished by means of removal of dissolved oxygen from the aqueous solution by evacuating the aqueous solution. Another way concerns exchange of dissolved oxygen for an inert gas, such as nitrogen ($N_2$) or argon (Ar), by means of bubbling the inert gas through the aqueous solution. It will be clear to a person skilled in the art that not all dissolved oxygen needs be removed or replaced by an inert gas in order to reach a positive effect on the state of the layer of silicon 3. The effect will be larger with increasing percentage of dissolved oxygen removed from the aqueous solution or replaced by an inert gas. Besides removal or exchange of dissolved oxygen a still further method involves the addition of a reducing agent, such as dissolved hydrogen ($H_2$) or a chemical such as dithionous acid ($H_2S_2O_4$), hyposulfuric acid ($H_2S_2O_6$) or formic acid (HCOOH). Hydrogen can be dissolved in the aqueous solution by bubbling it through the aqueous solution. It will be clear to a person skilled in the art that by application of two or more of the above-mentioned treatments of the aqueous solution an even more pronounced effect on the state of the layer of silicon 3 can be reached.

Depending on the wet etching process to be carried out, the aqueous solution may be applied with one or more other additives, such as, for example, a pH modifier to control the etch rate and/or etch selectivity, a surfactant to improve the surface wetting and/or an organic solvent to control e.g. the etch selectivity. Examples of a pH modifier are $NH_4OH$, $NH_4F$, HCl, $HNO_3$ and $H_2SO_4$.

The process of etching the inorganic anti-reflective layer 4 can be carried out by means of a multi-wafer process in e.g. a spray tool or a wet bench. A multi-wafer process is a process in which multiple wafers are processed simultaneously in one and the same process chamber. However, as the method according to the invention enables etch rates that are significantly higher than that of prior art methods, the process of etching the inorganic anti-reflective layer can also be advantageously carried out by means of a single-wafer process, i.e. a process in which just one wafer is processed in one and the same process chamber at a time.

After the gates have been defined, the device may be subjected to further usual and generally known process steps for the manufacture of integrated circuits, such as the provision of source and drain zones in the semiconductor body and the provision of connections between the transistors.

It will be obvious that the invention is not limited to the example described above, but that many more variations are possible to those skilled in the art within the scope of the invention. By way of example, the resist mask may also be removed after the layer of silicon is patterned.

What is claimed is:

1. A method of manufacturing a semiconductor device, comprising the provision of a substrate with a layer of silicon thereon, an inorganic anti-reflective layer applied to the layer of silicon, and a resist mask applied to the inorganic anti-reflective layer, which method comprises the steps of:
   patterning the inorganic anti-reflective layer by means of the resist mask,
   patterning the layer of silicon,
   removing the resist mask, and
   removing the inorganic anti-reflective layer by means of etching with an aqueous solution comprising hydrofluoric acid:
   wherein the aqueous solution is treated so as to keep the layer of silicon in a non-oxidized state during etching the inorganic anti-reflective layer.

2. A method as claimed in claim 1, wherein the inorganic anti-reflective layer is applied as a layer of silicon nitride or a layer of silicon oxynitride.

3. A method as claimed in claim 2, wherein a layer of silicon-rich silicon nitride is applied as the layer of silicon nitride.

4. A method as claimed in claim 2, wherein a layer of silicon-rich silicon oxynitride is applied as the layer of silicon oxynitride.

5. A method as claimed in claim 1, wherein the hydrofluoric acid is applied in a concentration in the range from about 0.001 to 0.1 M.

6. A method as claimed in claim 1, wherein the aqueous solution is applied at a temperature in the range from about 30° C. to 130° C., the aqueous solution being applied under elevated pressure to reach a temperature above 100° C.

7. A method as claimed in claim 6, wherein the aqueous solution is applied at a temperature in the range from 100° C. to 130° C.

8. A method as claimed in claim 1, wherein dissolved oxygen is removed from the aqueous solution by evacuating the aqueous solution.

9. A method as claimed in claim 1, wherein dissolved oxygen is removed from the aqueous solution by exchanging it for an inert gas.

10. A method as claimed in claim 1, wherein a reducing agent is added to the aqueous solution.

11. The method of claim 10, wherein the reducing agent is $H_2$.

12. The method of claim 11, further comprising providing the $H_2$ to the aqueous solution by bubbling.

13. A method as claimed in claim 1, wherein the substrate is applied with an uppermost layer of a dielectric material, with respect to which the inorganic anti-reflective layer can be selectively etched.

14. A method as claimed in claim 1, wherein a layer of polycrystalline silicon or a layer of amorphous silicon is applied as the layer of silicon.

15. A method as claimed in claim 1, wherein the resist mask is removed before the layer of silicon is patterned.

16. A method as claimed in claim 1, wherein the inorganic anti-reflective layer is etched by means of a single-wafer process.

17. The method of claim 1, wherein the aqueous solution further comprises a surfactant.

18. The method of claim 1, wherein the aqueous solution further comprises a pH modifier.

* * * * *